United States Patent
Brahma et al.

(10) Patent No.: US 10,388,223 B2
(45) Date of Patent: Aug. 20, 2019

(54) SYSTEM AND METHOD FOR VOLTAGE AND CURRENT SENSING FOR COMPENSATION IN AN ELECTRONIC DISPLAY VIA ANALOG FRONT END

(71) Applicant: Apple Inc., Cupertino, CA (US)

(72) Inventors: Kingsuk Brahma, San Francisco, CA (US); Mohammad B. Vahid Far, San Jose, CA (US)

(73) Assignee: Apple Inc., Cupertino, CA (US)

( * ) Notice: Subject to any disclaimer, the term of this patent is extended or adjusted under 35 U.S.C. 154(b) by 222 days.

(21) Appl. No.: 15/275,371

(22) Filed: Sep. 24, 2016

(65) Prior Publication Data

US 2018/0005579 A1 Jan. 4, 2018

Related U.S. Application Data

(60) Provisional application No. 62/357,081, filed on Jun. 30, 2016.

(51) Int. Cl.
*G09G 3/3258* (2016.01)
*G09G 3/3233* (2016.01)
(Continued)

(52) U.S. Cl.
CPC ......... *G09G 3/3258* (2013.01); *G09G 3/3233* (2013.01); *G09G 2300/0819* (2013.01);
(Continued)

(58) Field of Classification Search
CPC ...... G09G 3/30; G09G 3/3208; G09G 3/3225; G09G 3/3233; G09G 3/3258; G09G 3/3291; G09G 2300/0819; G09G 2300/0876; G09G 2310/0248; G09G 2310/0251; G09G 2310/08; G09G 2320/0295;
(Continued)

(56) References Cited

U.S. PATENT DOCUMENTS

2003/0174083 A1* 9/2003 Mayfield ............. H03M 1/1019
341/166
2008/0180365 A1* 7/2008 Ozaki .................. G09G 3/3233
345/76

(Continued)

FOREIGN PATENT DOCUMENTS

EP 2991066 A1 3/2016

*Primary Examiner* — Keith L Crawley
(74) *Attorney, Agent, or Firm* — Fletcher Yoder, P.C.

(57) ABSTRACT

An electronic device includes display circuitry with a source amplifier and a data line that drives signals provided by the source amplifier. Additionally, the display circuitry includes pixels, where each pixel includes a diode, and a scan thin-film-transistor (TFT) that selectively couples the pixels with the data line, based upon a scan control signal. Sensing circuitry of the electronic device includes a capacitor that is electrically coupled to the data line, wherein the capacitor is pre-charged by the source amplifier when the scan TFT is OFF and a sensing amplifier electrically coupled to the data line, providing a sensing output of both a diode voltage of the one or more pixels and a driving current of the one or more pixels, depending on the current operation of the sensing circuitry. Further, conversion circuitry converts the sensing output from an analog domain to a digital domain.

20 Claims, 12 Drawing Sheets

(51) Int. Cl.
*H03M 1/34* (2006.01)
*H03M 1/50* (2006.01)

(52) U.S. Cl.
CPC . *G09G 2310/0251* (2013.01); *G09G 2310/08* (2013.01); *G09G 2320/0295* (2013.01); *G09G 2320/043* (2013.01); *G09G 2320/045* (2013.01); *G09G 2330/12* (2013.01); *H03M 1/34* (2013.01); *H03M 1/50* (2013.01)

(58) Field of Classification Search
CPC ....... G09G 2320/043; G09G 2320/045; G09G 2330/12; H03M 1/00–645
See application file for complete search history.

(56) References Cited

U.S. PATENT DOCUMENTS

| | | | |
|---|---|---|---|
| 2013/0050292 A1* | 2/2013 | Mizukoshi | G09G 3/3291 345/690 |
| 2013/0093652 A1* | 4/2013 | Kim | G09G 3/3233 345/77 |
| 2013/0147694 A1* | 6/2013 | Kim | G09G 3/32 345/82 |
| 2013/0155038 A1* | 6/2013 | Yamashita | G09G 3/3233 345/204 |
| 2013/0162617 A1* | 6/2013 | Yoon | G09G 3/3291 345/211 |
| 2015/0091888 A1 | 4/2015 | Min et al. | |
| 2015/0294626 A1* | 10/2015 | Bi | G09G 3/3233 345/211 |
| 2015/0379909 A1 | 12/2015 | Yu et al. | |
| 2015/0379937 A1 | 12/2015 | Kim et al. | |
| 2016/0012798 A1* | 1/2016 | Oh | G09G 3/325 345/205 |
| 2016/0203764 A1* | 7/2016 | In | G09G 3/3225 345/215 |
| 2017/0154573 A1* | 6/2017 | Woo | G09G 3/3283 |
| 2017/0309231 A1* | 10/2017 | Li | G09G 3/3225 |
| 2018/0082642 A1* | 3/2018 | Yamanaka | G09G 3/20 |
| 2018/0137819 A1* | 5/2018 | An | G09G 3/3233 |

\* cited by examiner

SYSTEM AND METHOD FOR VOLTAGE AND CURRENT SENSING FOR COMPENSATION IN AN ELECTRONIC DISPLAY VIA ANALOG FRONT END

CROSS REFERENCE TO RELATED APPLICATIONS

This application is a Non-Provisional patent application of U.S. Provisional Patent Application No. 62/357,081, entitled "SYSTEM AND METHOD FOR VOLTAGE SENSING FOR COMPENSATION IN AN ELECTRONIC DISPLAY VIA ANALOG FRONT END", filed Jun. 30, 2016, which are herein incorporated by reference.

BACKGROUND

This disclosure relates to external compensation for voltage shifts in display panels. More specifically, the disclosure relates to sensing operational parameters of pixel circuitry and provides compensation when these operational parameters shift.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Numerous electronic devices include electronic displays, which display images by varying the amount of light that is emitted from an array of pixels of different colors. For pixels that use self-emissive elements, such as organic light emitting diodes (OLEDs), pixel non-uniformities may arise due to light-emitting diode (LED) voltage changes (e.g., Voled), and/or LED current changes (e.g., Ioled). These pixel non-uniformities could produce a degradation in image quality as pixels change over time. Changes in the pixels may be caused by many different factors. For example, changes in the pixels may be caused by temperature changes of the display, an aging of the display (e.g., aging of the thin-film-transistors (TFTs)), the operation of certain display processes, and other factors.

To counteract image degradation caused by changes in the display, it may be desirable to implement in-pixel or per-pixel compensation for the changes. Yet as pixels per inch (PPI) increase, in-pixel or per-pixel compensation logic for these changes may become more and more limited. For example, high pixels-per-inch displays may include a smaller pixel circuit footprint. Thus, a size of the in-pixel or per-pixel compensation circuits may become a limiting factor. Further, timing constraints for these high-PPI displays may result timing limitations on the in-pixel or per-pixel compensation circuits.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

To improve image quality and consistency, external compensation circuitry may be used to counteract negative artifacts caused by variations within a pixel. Further, the external compensation circuitry may be used to counteract negative artifacts from light-emitting diode (LED) (e.g., Organic light-emitting diode) voltage shifts that may occur over time. In the current embodiments, lines carrying a data voltage (Vdata) and/or a reference voltage (Vref) may be used to sense LED voltages (Voled) and/or an LED current (e.g., Ioled) that may be used for subsequent compensation that is external to the pixel circuitry. For example, Voled and/or Ioled values may be used in compensation logic that adjusts a display output based upon the Voled and/or Ioled values that are received by the compensation logic.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

This disclosure relates to compensation for light-emitting diode (LED) (e.g., organic LEDs (OLEDs)) voltage (Voled) shifts, and/or LED (e.g., organic LEDs (Oleds)) current (Ioled) shifts that may occur in in display panels. In some cases, this compensation may take place in real time or near-real time. More specifically, the current embodiments describe techniques for reusing many components of a display panel's circuitry to provide external-to-the-pixel measurement of Voled and/or Ioled. These measurements may be provided to compensation logic (e.g., in the display or external to the display) that alters display output based upon shifts in the Voled and/or Ioled.

Figure 1:
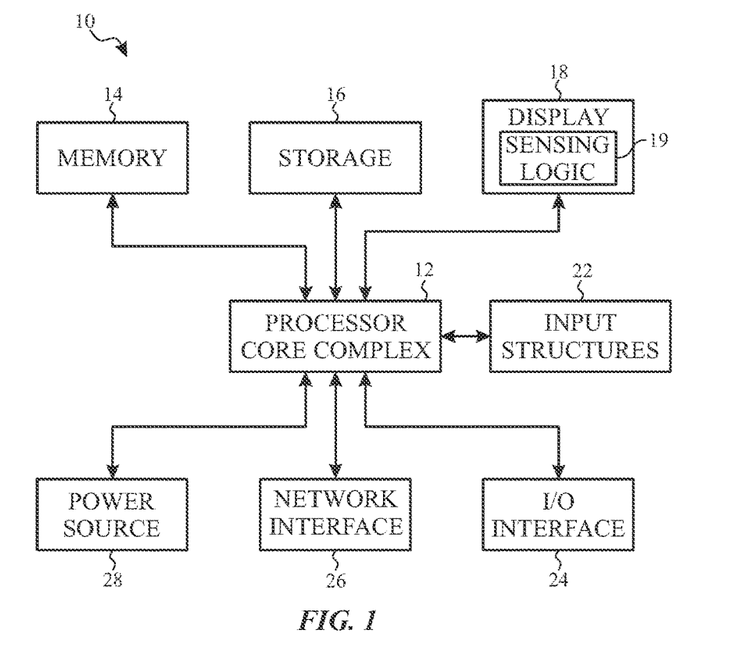
FIG. 1 is a schematic block diagram of an electronic device including a display, in accordance with an embodiment.

Turning first to FIG. 1, an electronic device 10 according to an embodiment of the present disclosure may include, among other things, a processor core complex 12 having one or more processor(s), memory 14, nonvolatile storage 16, a display 18, input structures 22, an input/output (I/O) interface 24, network interfaces 26, and a power source 28. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in electronic device 10.

Figure 2:
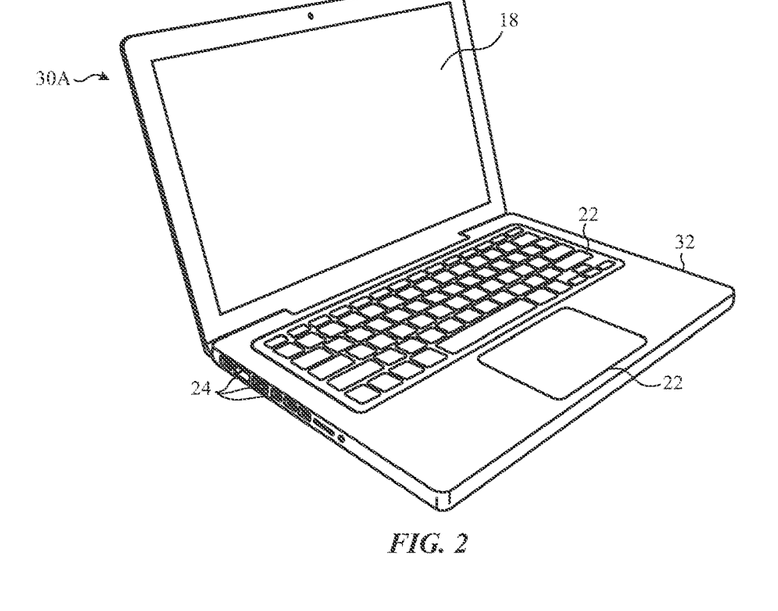
FIG. 2 is a perspective view of a notebook computer representing an embodiment of the electronic device of FIG. 1, in accordance with an embodiment.
Figure 3:
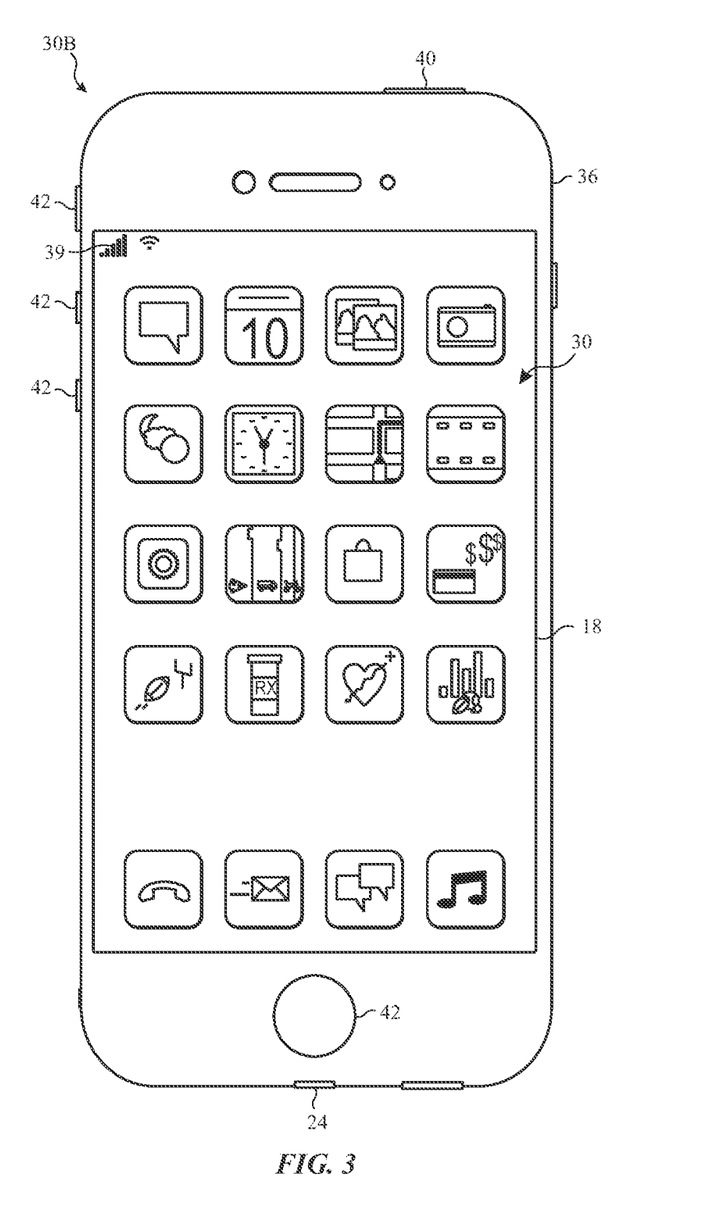
FIG. 3 is a front view of a hand-held device representing another embodiment of the electronic device of FIG. 1, in accordance with an embodiment.
Figure 4:
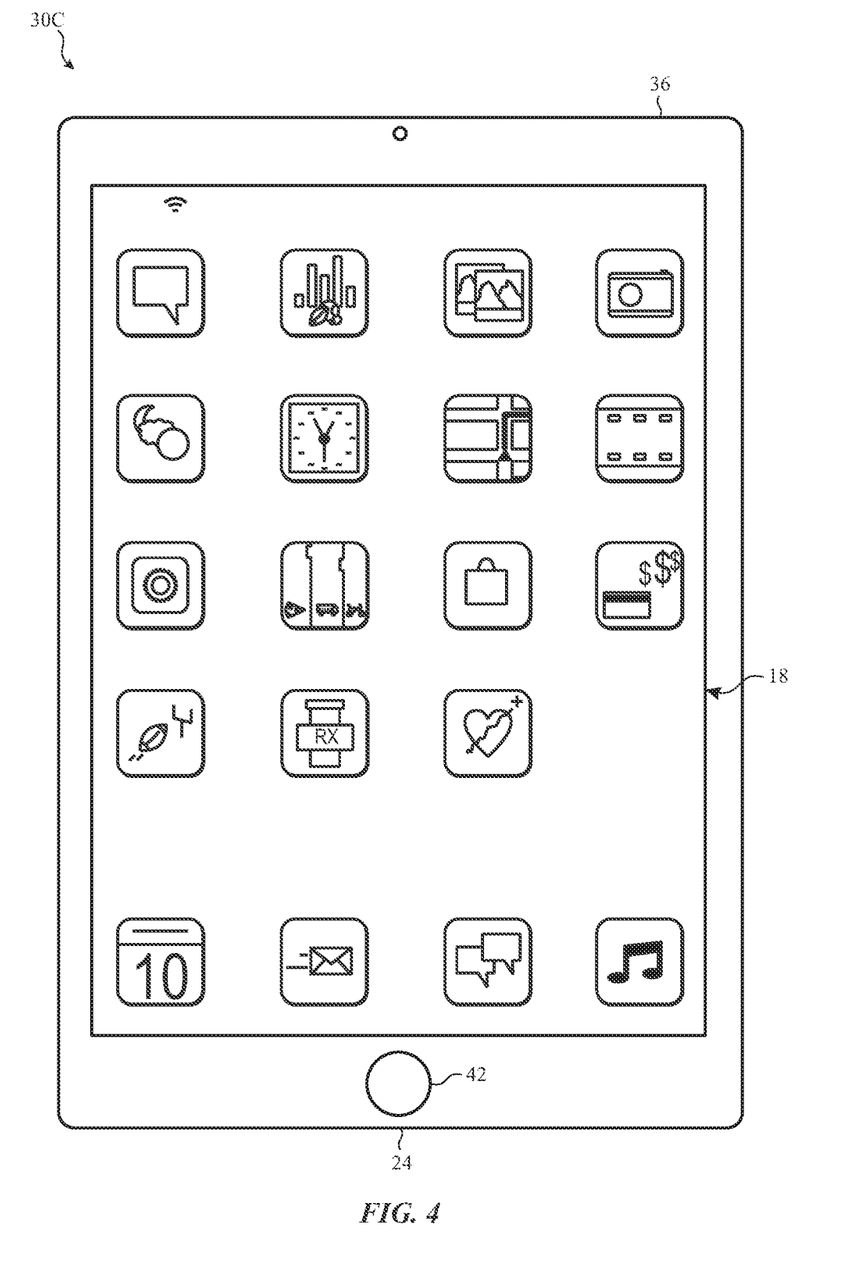
FIG. 4 is a front view of another hand-held device representing another embodiment of the electronic device of FIG. 1, in accordance with an embodiment.
Figure 5:
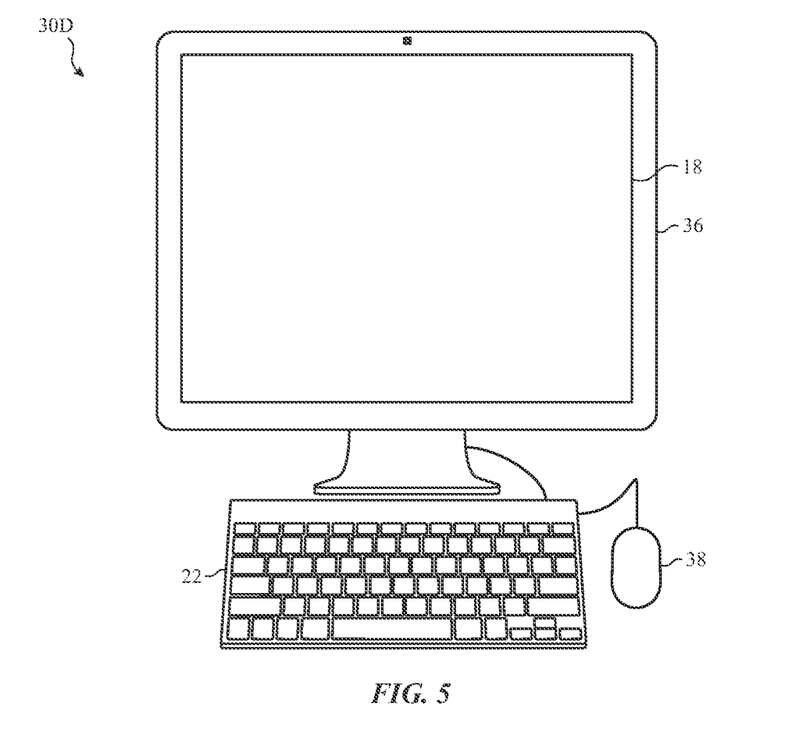
FIG. 5 is a front view of a desktop computer representing another embodiment of the electronic device of FIG. 1, in accordance with an embodiment.

By way of example, the electronic device 10 may represent a block diagram of the notebook computer depicted in FIG. 2, the handheld device depicted in FIG. 3, the desktop computer depicted in FIG. 4, the wearable electronic device depicted in FIG. 5, or similar devices. It should be noted that the processor core complex 12 and/or other data processing circuitry may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor core complex 12 and/or other data processing circuitry may be operably coupled with the memory 14 and the nonvolatile memory 16 to perform various algorithms. Such programs or instructions executed by the processor core complex 12 may be stored in any suitable article of manufacture that may include one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. Also, programs (e.g., an operating system) encoded on such a computer program product may also include instructions that may be executed by the processor core complex 12 to enable the electronic device 10 to provide various functionalities.

As will be discussed further below, the display 18 may include pixels such as organic light emitting diodes (OLEDs), micro-light-emitting-diodes (µ-LEDs), or any self-emissive elements or light emitting diodes (LEDs). Further, the display 18 is not limited to a particular pixel type, as the circuitry and methods disclosed herein may apply to any pixel type. Accordingly, while particular pixel structures may be illustrated in the present disclosure, the present disclosure may relate to a broad range of lighting components and/or pixel circuits within display devices.

The display 18 and/or other components of the electronic device 10 (e.g., the processor core complex 12) may include sensing logic circuitry 19, which may sense voltage and/or current measurements within the display 18. These sensed measurements may be used to adjust pixel output, for example, when pixel variations occur within the display 18. This circuitry 19 will be discussed in more detail below.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interfaces 26. The network interfaces 26 may include, for example, interfaces for a personal area network (PAN), such as a Bluetooth network, for a local area network (LAN) or wireless local area network (WLAN), such as an 802.11x Wi-Fi network, and/or for a wide area network (WAN), such as a 3rd generation (3G) cellular network, 4th generation (4G) cellular network, or long term evolution (LTE) cellular network. The network interface 26 may also include interfaces for, for example, broadband fixed wireless access networks (WiMAX), mobile broadband Wireless networks (mobile WiMAX), asynchronous digital subscriber lines (e.g., 1SSL, VDSL), digital video broadcasting-terrestrial (DVB-T) and its extension DVB Handheld (DVB-H), ultra Wideband (UWB), alternating current power lines, and so forth.

In certain embodiments, the electronic device 10 may take the form of a computer, a portable electronic device, a wearable electronic device, or other type of electronic device. Such computers may include computers that are generally portable (such as laptop, notebook, and tablet computers) as well as computers that are generally used in one place (such as conventional desktop computers, workstations and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of a notebook computer 30A, is illustrated in FIG. 2 in accordance with one embodiment of the present disclosure. The depicted computer 30A may include a housing or enclosure 32, a display 18, input structures 22, and ports of an I/O interface 24. In one embodiment, the input structures 22 (such as a keyboard and/or touchpad) may be used to interact with the computer 30A, such as to start, control, or operate a GUI or applications running on computer 30A. For example, a keyboard and/or touchpad may allow a user to navigate a user interface or application interface displayed on display 18.

FIG. 3 depicts a front view of a handheld device 30B, which represents one embodiment of the electronic device 10. The handheld device 34 may represent, for example, a portable phone, a media player, a personal data organizer, a handheld game platform, or any combination of such devices. By way of example, the handheld device 34 may be a model of an iPod® or iPhone® available from Apple Inc. of Cupertino, Calif.

The handheld device 30B may include an enclosure 36 to protect interior components from physical damage and to shield them from electromagnetic interference. The enclosure 36 may surround the display 18, which may display indicator icons 39. The indicator icons 39 may indicate, among other things, a cellular signal strength, Bluetooth connection, and/or battery life. The I/O interfaces 24 may open through the enclosure 36 and may include, for example, an I/O port for a hard wired connection for charging and/or content manipulation using a standard connector and protocol, such as the Lightning connector provided by Apple Inc., a universal service bus (USB), or other similar connector and protocol.

User input structures 42, in combination with the display 18, may allow a user to control the handheld device 30B. For example, the input structure 40 may activate or deactivate the handheld device 30B, the input structure 42 may navigate user interface to a home screen, a user-configurable application screen, and/or activate a voice-recognition feature of the handheld device 30B, the input structures 42 may provide volume control, or may toggle between vibrate and ring modes. The input structures 42 may also include a microphone may obtain a user's voice for various voice-related features, and a speaker may enable audio playback and/or certain phone capabilities. The input structures 42 may also include a headphone input may provide a connection to external speakers and/or headphones.

FIG. 4 depicts a front view of another handheld device 30C, which represents another embodiment of the electronic device 10. The handheld device 30C may represent, for example, a tablet computer, or one of various portable computing devices. By way of example, the handheld device 30C may be a tablet-sized embodiment of the electronic device 10, which may be, for example, a model of an iPad® available from Apple Inc. of Cupertino, Calif.

Turning to FIG. 5, a computer 30D may represent another embodiment of the electronic device 10 of FIG. 1. The computer 30D may be any computer, such as a desktop computer, a server, or a notebook computer, but may also be a standalone media player or video gaming machine. By way of example, the computer 30D may be an iMac®, a MacBook®, or other similar device by Apple Inc. It should be noted that the computer 30D may also represent a personal computer (PC) by another manufacturer. A similar enclosure 36 may be provided to protect and enclose internal components of the computer 30D such as the display 18. In certain embodiments, a user of the computer 30D may interact with the computer 30D using various peripheral input devices, such as the input structures 22 or mouse 38, which may connect to the computer 30D via a wired and/or wireless I/O interface 24.

Figure 6:
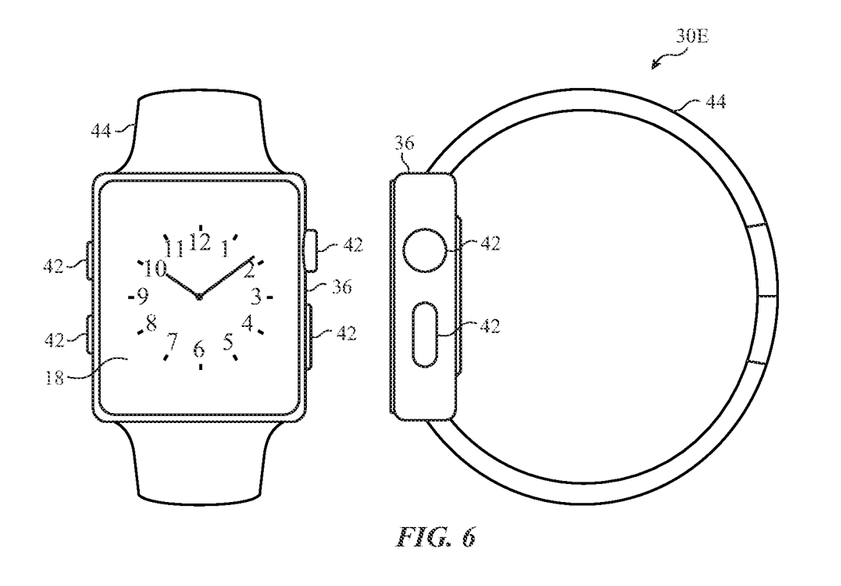
FIG. 6 is a front view of a wearable electronic device representing another embodiment of the electronic device of FIG. 1, in accordance with an embodiment.

Similarly, FIG. 6 depicts a wearable electronic device 30E representing another embodiment of the electronic device 10 of FIG. 1 that may be configured to operate using the techniques described herein. By way of example, the wearable electronic device 30E, which may include a wristband 43, may be an Apple Watch® by Apple, Inc. However, in other embodiments, the wearable electronic device 30E may include any wearable electronic device such as, for example, a wearable exercise monitoring device (e.g., pedometer, accelerometer, heart rate monitor), or other device by another manufacturer. The display 18 of the wearable electronic device 30E may include a touch screen, which may allow users to interact with a user interface of the wearable electronic device 30E.

Figure 7:
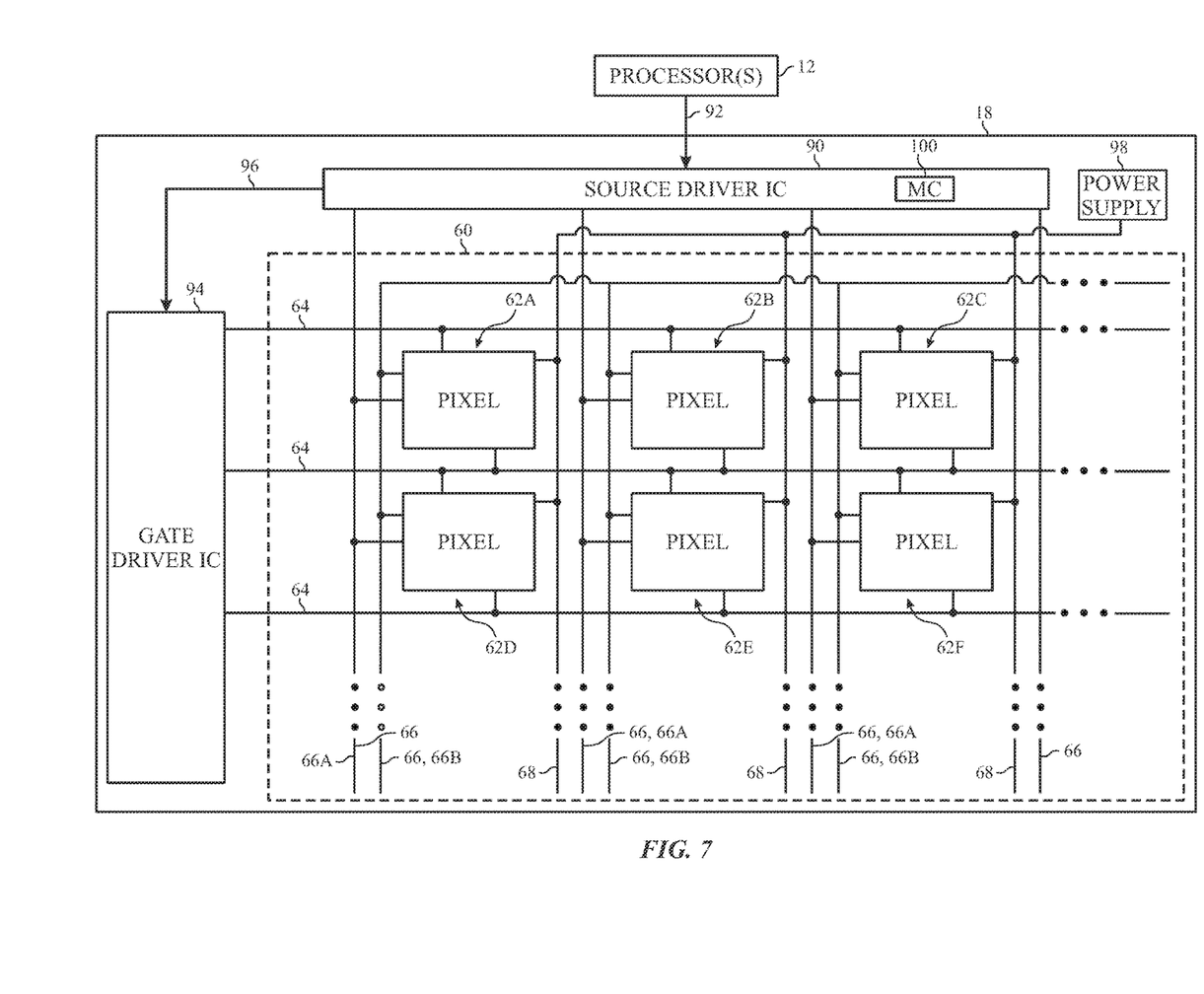
FIG. 7 is a circuit diagram illustrating a portion of a matrix of pixels of the display of FIG. 1, in accordance with an embodiment.

The display 18 for the electronic device 10 may include a matrix of pixels that contain light emitting circuitry. Accordingly, FIG. 7 illustrates a circuit diagram including a portion of a matrix of pixels of the display 18. As illustrated, the display 18 may include a display panel 60. Moreover, the display panel 60 may include multiple unit pixels 62 arranged as an array or matrix defining multiple rows and columns of the unit pixels 62 that collectively form a viewable region of the display 18 in which an image may be displayed. In such an array, each unit pixel 62 may be defined by the intersection of rows and columns, represented here by the illustrated gate lines 64 (also referred to as "scanning lines") and data lines 66 (also referred to as "source lines"), respectively. Additionally, power supply lines 68 may provide power to each of the unit pixels 62.

Although only six unit pixels 62, referred to individually by reference numbers 62a-62f, respectively, are shown, it should be understood that in an actual implementation, each data line 66 and gate line 64 may include hundreds or even thousands of such unit pixels 62. By way of example, in a color display panel 60 having a display resolution of 1024× 768, each data line 66, which may define a column of the pixel array, may include 768 unit pixels, while each gate line 64, which may define a row of the pixel array, may include 1024 groups of unit pixels with each group including a red, blue, and green pixel, thus totaling 3072 unit pixels per gate line 64. By way of further example, the panel 60 may have a resolution of 480×320 or 960×640. In the presently illustrated example, the unit pixels 62a, 62b, and 62c may represent a group of pixels having a red pixel (62a), a blue pixel (62b), and a green pixel (62c). The group of unit pixels 62d, 62e, and 62f may be arranged in a similar manner. Additionally, in the industry, it is also common for the term "pixel" to sometimes refer to a group of adjacent different-colored pixels (e.g., a red pixel, blue pixel, and green pixel), with each of the individual colored pixels in the group being referred to as a "sub-pixel."

The display 18 also includes a source driver integrated circuit (IC) 90, which may include a chip, such as a processor or ASIC, configured to control various aspects of the display 18 and panel 60. For example, the source driver IC 90 may receive image data 92 from the processor(s) 12 and send corresponding image signals to the unit pixels 62 of the panel 60. The source driver IC 90 may also be coupled to a gate driver IC 94, which may be configured to provide/remove gate activation signals to activate/deactivate rows of unit pixels 62 via the gate lines 64. The source driver IC 90 may include a timing controller that determines and sends timing information/image signals 96 to the gate driver IC 94 to facilitate activation and deactivation of individual rows of unit pixels 62. In other embodiments, timing information may be provided to the gate driver IC 94 in some other manner (e.g., using a timing controller that is separate from the source driver IC 90). Further, while FIG. 7 depicts only a single source driver IC 90, it should be appreciated that other embodiments may utilize multiple source driver ICs 90 to provide image signals 96 to the unit pixels 62. For example, additional embodiments may include multiple source driver ICs 90 disposed along one or more edges of the panel 60, with each source driver IC 90 being configured to control a subset of the data lines 66 and/or gate lines 64.

In operation, the source driver IC 90 receives image data 92 from the processor 12 or a discrete display controller and, based on the received data, outputs signals to control the unit pixels 62. When the unit pixels 62 are controlled by the source driver IC 90, circuitry within the unit pixels 62 may complete a circuit between a power source 98 and light elements of the unit pixels 62. Additionally, to measure operating parameters of the display 18, measurement circuitry (MC) 100 may be positioned within the source driver IC 90 to read various voltage and current characteristics of the display 18, as discussed in detail below.

Figure 8:
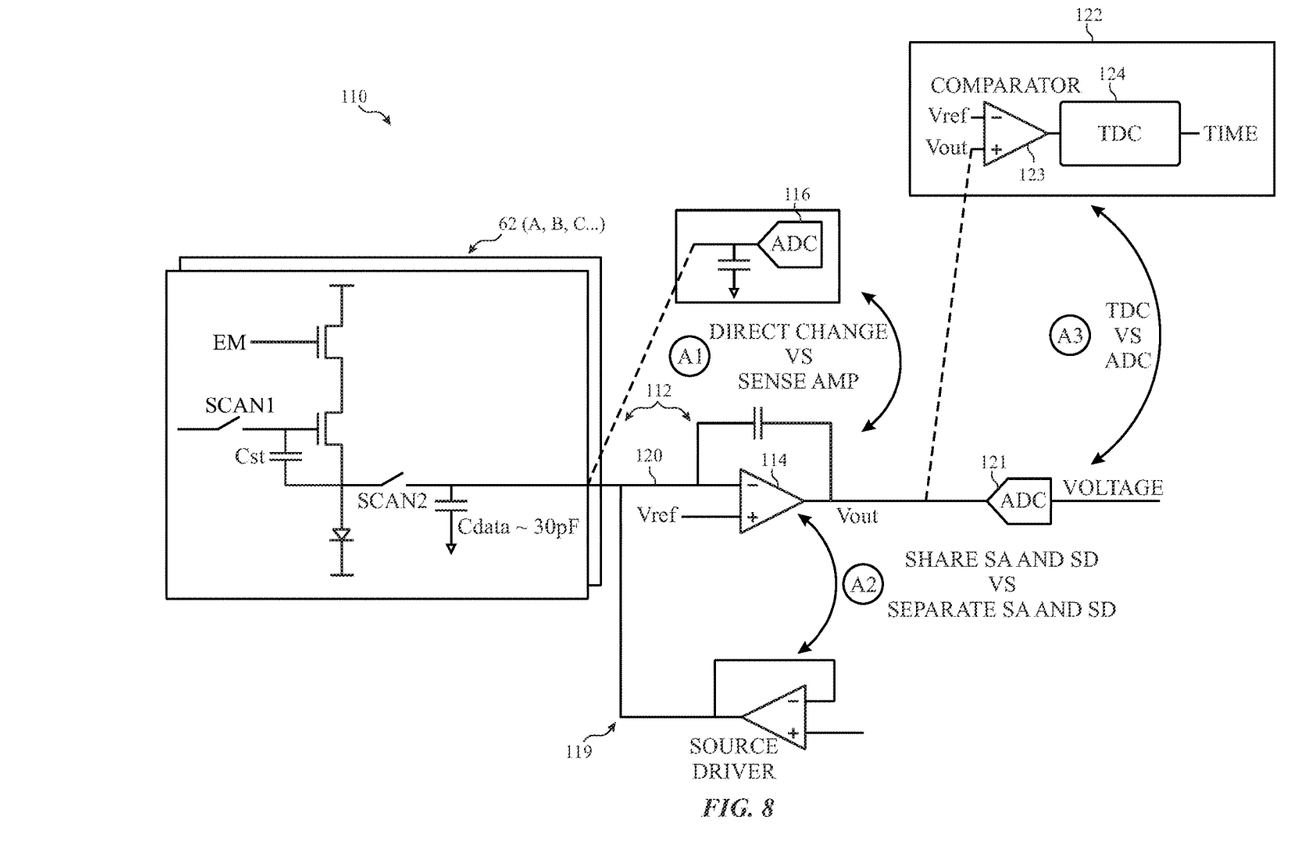
FIG. 8 is a circuit diagram illustrating a sensing front end for voltage sensing, in accordance with an embodiment.

FIG. 8 illustrates a schematic diagram of a sensing circuit 110, in accordance with an embodiment. The sensing circuit 110 may include a pixel 62 (e.g., an OLED pixels 62 A, B, C, etc.). A group of pixels (e.g., 62 A, B, C, etc.) may be associated with a common sensing channel 112. When direct sensing is utilized, each sensing channel 112 may include a sensing amplifier (which may be in an integration mode) 114 and digital conversion circuitry 116 to change the sensing output to the digital domain for further processing. Processing may occur pre- or post-conversion by the digital conversion circuitry 116. This option is illustrated by configuration A1. Additionally or alternatively, a separate sense path may be utilized, as indicated by configuration A2.

In addition to the sensing path 112, the sensing circuit also includes a driving path 119 to drive the line 120 during normal operation of the circuitry 110. Further, a subsequent analog-to-digital converter (ADC) 121 and/or time domain conversion (TDC) configuration 122 may be utilized to convert the Vout to the digital domain, as indicated by configuration A3. For example, the TDC configuration 122 may include a comparator 123 and time domain converter (TDC) 124 may be used in the sensing circuit 110. In some embodiments, the TDC configuration 122 may include a successive approximation register (SAR) ADC, pipeline ADC, delta-sigma ADC, etc.

In some embodiments, the sensing circuitry may utilize multiple sets of sensing amplifiers to provide sensing. For example, one amplifier may be used for positive voltages associated with a TFT, while another may be used for negative voltages associated with the pixel, because the range of the soft block for the transistors may not be sufficient for both positive and negative voltages. Accordingly, two sensing amplifiers may be used.

Unfortunately, however, second-order problems may arise with the addition of new sensing amplifiers. For example, additional digital-to-analog-converters may be included for the additional sensing amplifiers. Further, management of ADC's with the additional channels of the additional sensing amplifiers is more complex. Additionally, programming of the switches in the sensing amplifiers may be more difficult as sensing amplifiers are added.

Further, in some embodiments, a reference voltage (Vref) and parasitic capacitance of transistors and/or capacitors of the circuitry may be relied upon for sensing. Unfortunately, however, in such embodiments, the headroom margin for the Vref may be limited and the parasitic values of the transistors and/or capacitors of the circuitry may not be known, and thus may involve calibration.

Figure 9:
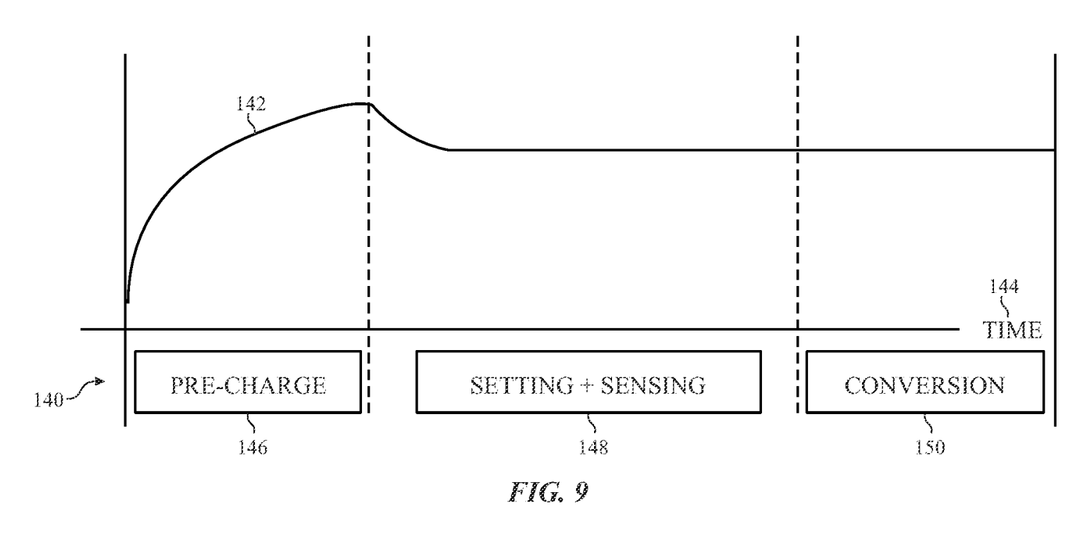
FIG. 9 is a timing diagram illustrating a process and associated timing for voltage and current sensing, in accordance with an embodiment.
Figure 10:
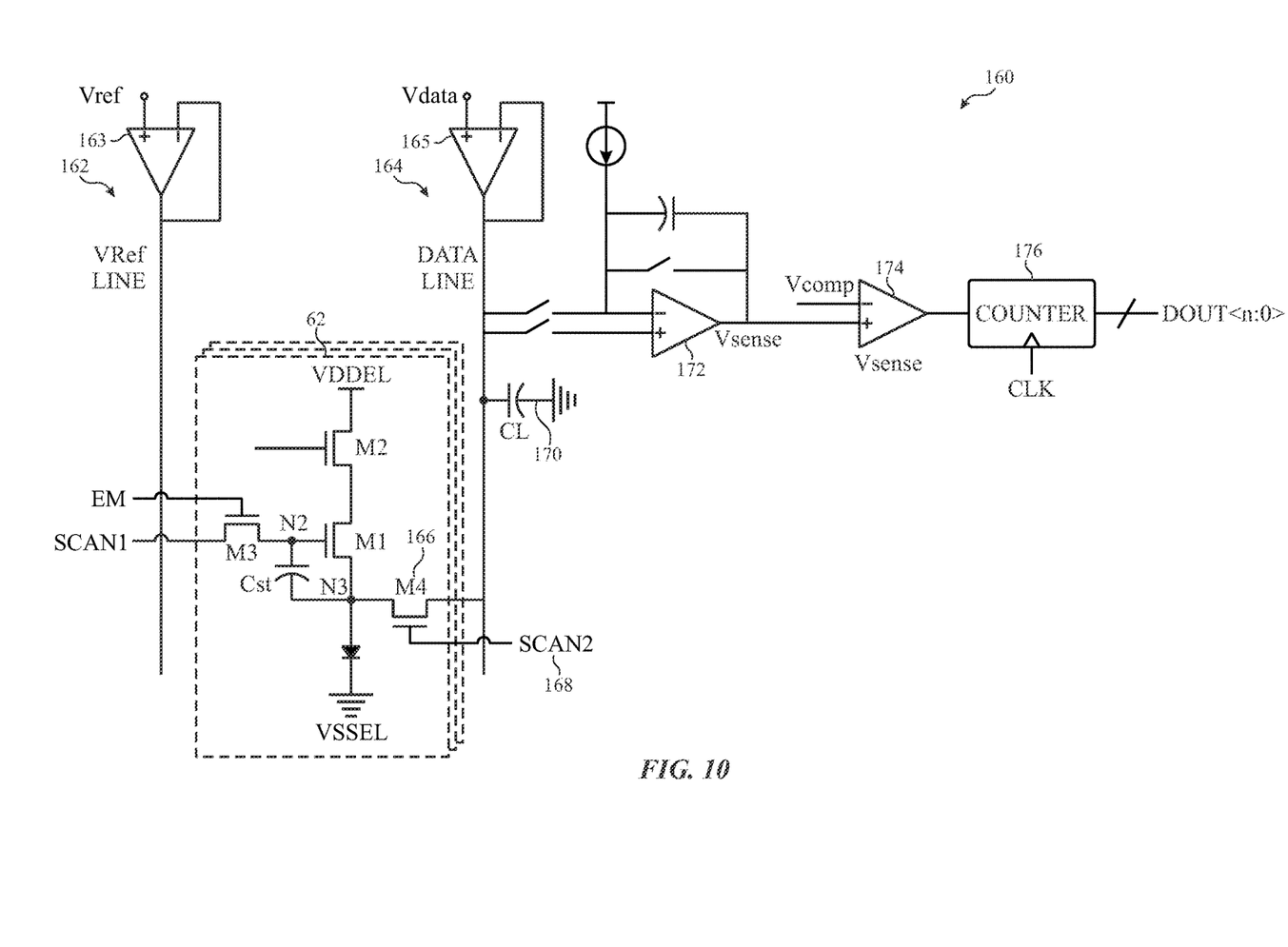
FIG. 10 is a circuit diagram illustrating a pixel and corresponding sensing circuitry, which may implement the process of FIG. 9, in accordance with an embodiment.
Figure 11A:
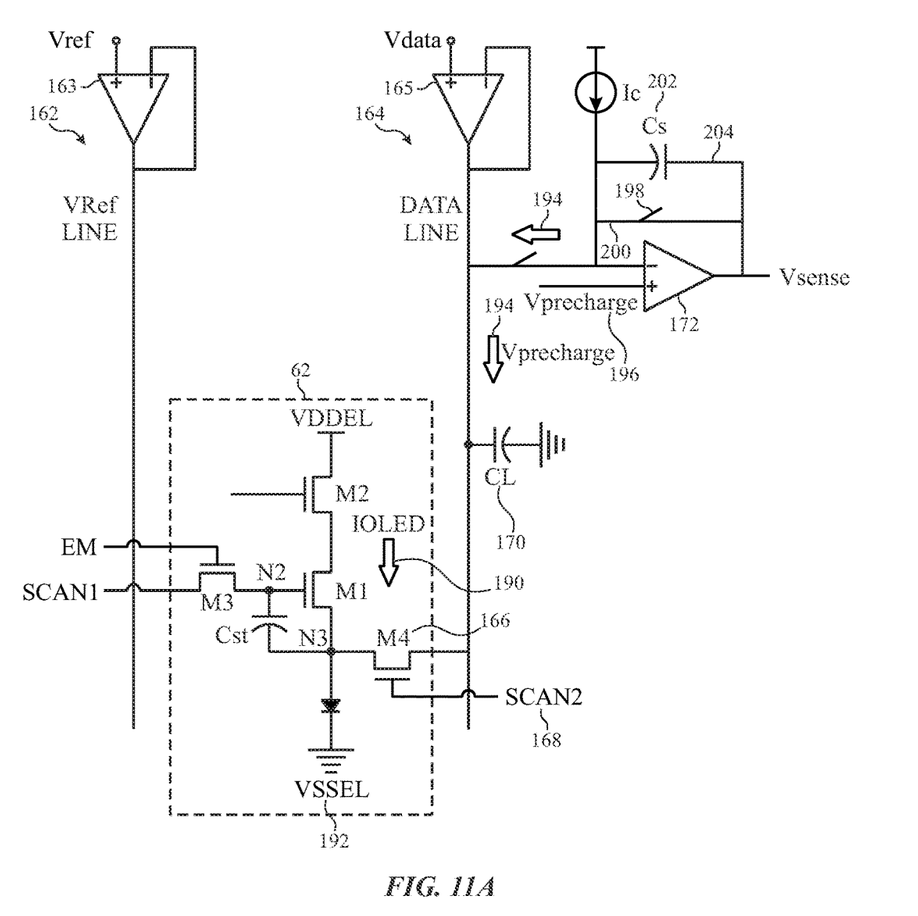
FIG. 11A is a circuit diagram illustrating an approach to a first phase of voltage sensing, in accordance with an embodiment.
Figure 11B:
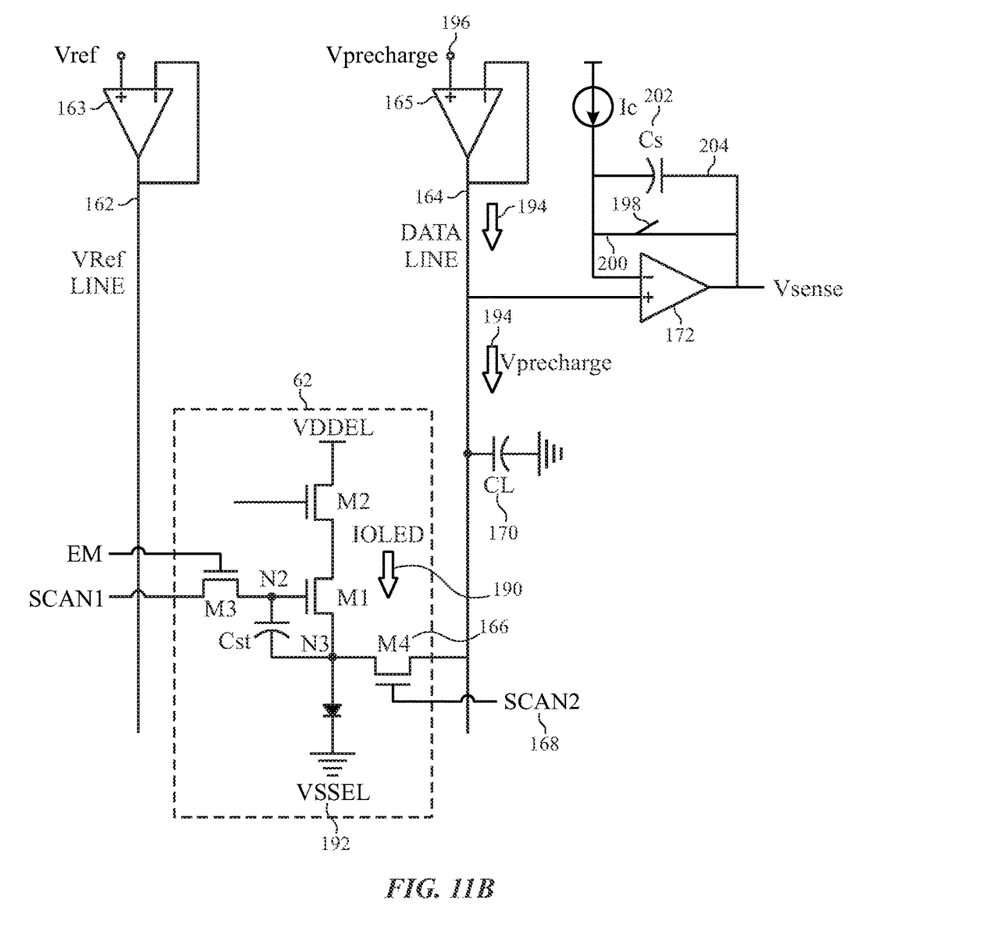
FIG. 11B is a circuit diagram illustrating a second approach to a first phase of voltage sensing, in accordance with an embodiment.
Figure 12:
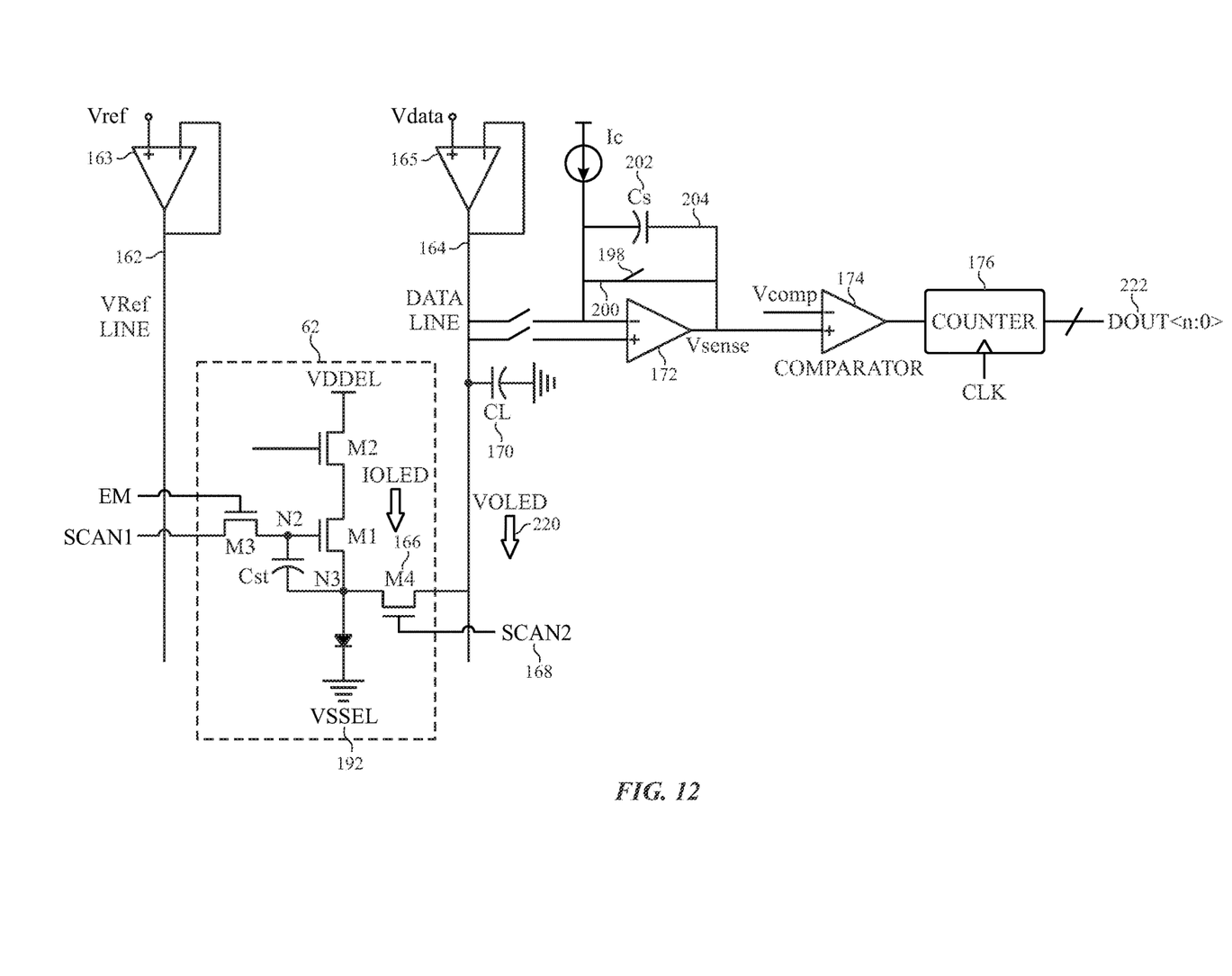
FIG. 12 is a circuit diagram illustration a second phase of voltage sensing, in accordance with an embodiment.
Figure 13:
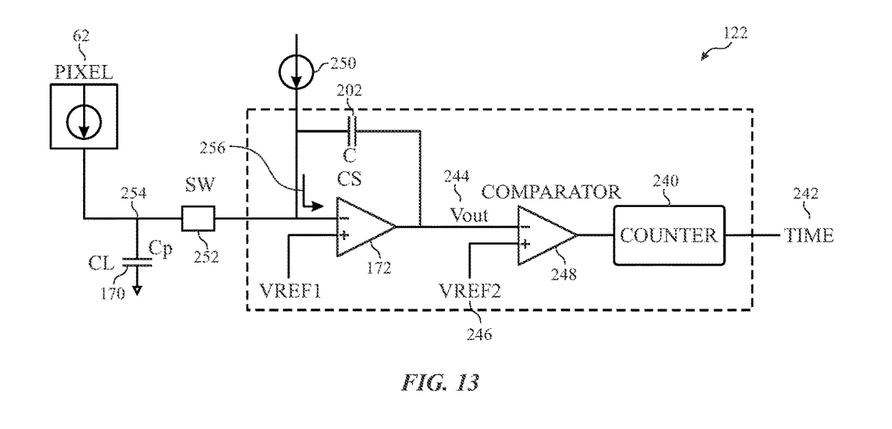
FIG. 13 illustrates circuitry for implementing the conversion phase of the process of FIG. 9, in accordance with an embodiment.

With this in mind, FIG. 9 is a timing diagram illustrating a process 140 for sensing pixel and diode measurements, using sensing circuitry, in accordance with an embodiment. FIG. 9 also illustrates voltage measurements 142 associated with the process 140 phases over time 144. The process 140 begins with a pre-charging phase 146. As illustrated, during the pre-charging phase 146, the voltage measurements 142 are increased. Once pre-charging 146 is complete, a settling and sensing phase 148 is implemented. As illustrated, during this phase, the voltage measurements 142 settle, such that a settled measurement may be taken. A conversion phase 150 may then be implemented to convert the sensed results into the digital domain. Each of these phases will be discussed in more detail below. FIG. 10 illustrates sensing circuitry that may implement each of the phases 146, 148, and 150. FIGS. 11A and 11B illustrate embodiments of implementing the pre-charging phase 146. FIGS. 12A and 12B illustrate embodiments of circuitry for implementing the setting and sensing phase 148 and the conversion phase 150 of FIGS. 11A and 11B, respectively. FIG. 13 illustrates data conversion circuitry useful for the conversion phase 150, in accordance with an embodiment.

Starting first with an overview of sensing circuitry 160 of FIG. 10, the sensing circuitry 160 may include a reference voltage line (Vref) with voltage references sourced from a reference voltage amplifier 163, a data line (Vdata) 164 with data sourced from a source amplifier 165, and a set of pixels 62 associated with the Vdata line 164. The pixels 62 may include a TFT M4 166 that may be set to "ON" or "OFF" based upon a signal Scan2 168. A parasitic capacitor (CL) 170 may also be included, along with a sensing amplifier (Vsense) 172, a comparator 174, and counter 176. These features may be used to complete the pre-charging phase 146, the settling and sensing phase 148, and/or the conversion phase 150.

Turning now to the pre-charging phase 146, during this pre-charging phase 146, the pixels 62 may operate in normal operation, while the sensing amplifier 172 and/or source amplifier drives a parasitic capacitor (CL) to a voltage higher than a threshold voltage of a diode (VOLED). For example, as illustrated by arrows 190 in FIGS. 11A and 11B, the diode current (IOLED) flows to the diode (VSSEL) 192, indicating normal operation. The transistor M4 166 may be set to "OFF" via the Scan2 signal 168, such that the data line 164 does not electrically couple with the pixels 62. Accordingly, the pre-charge 194 may charge the parasitic capacitor (CL) 170, rather than the pixels 62. As mentioned above, the pre-charge 194 may be sourced from either the sensing amplifier (Vsense) 172 (as illustrated in the embodiment of FIG. 11A) or from the source amplifier (Vdata) 165 (as illustrated in the embodiment of FIG. 11B).

As depicted in FIG. 11A, the pre-charge source 196 may be provided through the sensing amplifier 172. In such embodiments, the switch 198 may be closed, such that the pre-charge voltage 194 is provided to the data line 164 via pathway 200, rather than to the integrator capacitor (Cs) 202 via pathway 204. Alternatively or additionally, as depicted in FIG. 11B, the pre-charge source 196 may be provided through the source amplifier 165.

FIG. 12 illustrates the settling and sensing phase 148 and the conversion phase 150. In the settling and sensing phase 148, the transistor M4 166 is turned on via Scan2 line 168. The parasitic capacitor (CL) 170 is discharged to the VOLED 220. Further, the sensing amplifier 172 acts as a buffer to read out the VOLED 220. In the conversion phase 150, an analog-to-digital-converter may receive multiple samples of the VOLED 220, and provide an average of the multiple samples in the digital domain (e.g., using the comparator 174 and counter 176), resulting in the digital output (dout) 222 of an averaged multi-sample of VOLED 220.

As may be appreciated, the current approach may have several benefits over other embodiments that rely on other factors. For example, in some embodiments, a diode current (IOLED) may be applied to obtain diode voltage (VOLED) sensing. However, in such embodiments, a large setting time for the IOLED may be used. Further, the current approach results in a sensing amplifier gain of 1 (because a buffer is used instead of an integrator), as opposed to the capacitance of the parasitic capacitor (CL)/the capacitance of a feedback capacitor (Cf), resulting in less output noise and faster settling times. Additionally, direct VOLED measurements may be sensed and one sensing amplifier may be used for sensing of both a current of a driving thin-film-transistor (ITFT) current and the diode voltage (VOLED). For example, when measuring ITFT, switch M4 166 may be set to allow the pixel 62 current to flow to the sensing amplifier 172 and the integrator capacitor (Cs) 202. The integrator capacitor (Cs) 202 may integrate the current ITFT, resulting in a ramped output. Once the ramping stops, the conversion may occur. Using these techniques for obtaining the ITFT and VOLED, the operational range of the sensing amplifier 172 may be between approximately −3 and 0 volts for the ITFT and between approximately 0 and 3 volts for the VOLED. Accordingly, one sensing amplifier 172 with a ±3 volt capability may be used for both ITFT and VOLED measurements, as opposed to other embodiments that may utilizes two sensing amplifiers (e.g., one in the positive domain and one in the negative domain) to obtain these values.

Figure 14:
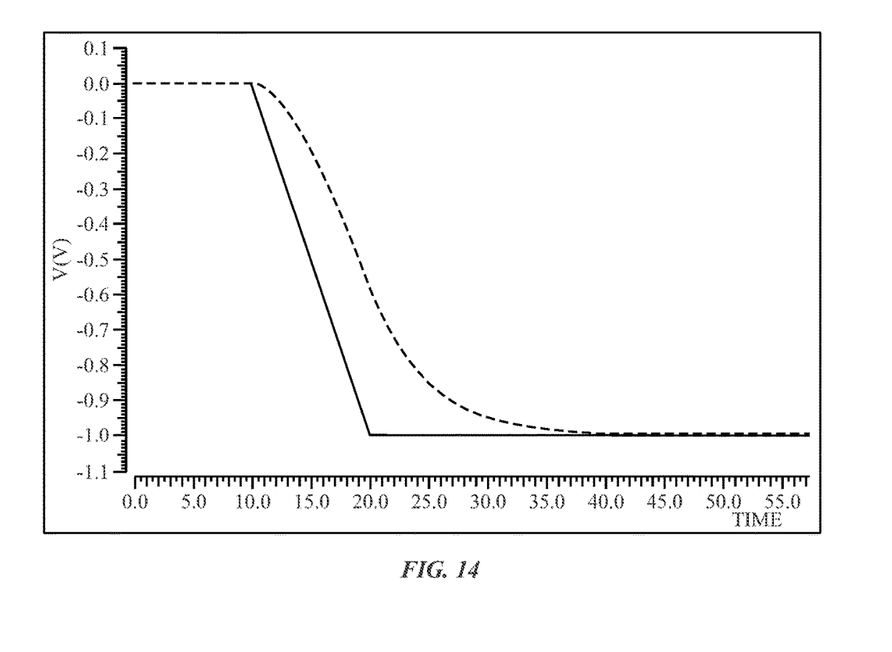
FIG. 14 illustrates a function of voltage transitioning over time, in accordance with an embodiment.

Turning to a more detailed description of the analog-to-digital conversion phase 150, FIG. 13 illustrates a TDC conversion configuration 122, in accordance with an embodiment. In TDC conversions, the slope of a function of time between voltage transitioning between a first voltage level and a second voltage level may be used to estimate voltage measurements. FIG. 14 illustrates such a function of time between voltage transitioning. Since amplifiers (e.g., sensing amplifier 172) may have a limited bandwidth and the feedback factor of the parasitic capacitor (CL) 170 (e.g., the ratio of CS/CP) may be quite large (e.g., because CL 170 may be a relatively large capacitor), this could cause the amplifier 172 to be relatively slow, involving an extended settling time.

To increase the sensing amplifier 172 speed, a current source 250 may be introduced for leakage compensation, calibration, and dual slope analog-to-digital conversion. The current source 250 may be applied such that, when the switch 252 causes disconnection between line 254 and the sensing amplifier 172, a large feedback 256 is provided to the sensing amplifier 172, causing increased amplifier 172 speed. For the TDC conversion configuration 122, a counter 240 may be used to calculate a time 242 (e.g., a number of clock cycles) between the voltage (Vout) 244 transition to an alternative level (e.g., VREF2 246). This may be determined using the comparator 248, as illustrated in FIG. 13.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. An electronic device, comprising:
display circuitry, comprising:
a source amplifier configured to drive display data signals;
a data line configured to carry the display data signals provided by the source amplifier;
one or more pixels;
a scan thin-film-transistor (TFT), configured to selectively electrically couple the one or more pixels with the data line, based upon a scan control signal; and
sensing circuitry, comprising:
a parasitic capacitor electrically coupled to the data line, wherein the parasitic capacitor is pre-charged when the scan TFT is operated into an OFF state, and wherein the one or more pixels are permitted to emit light during at least a portion of the pre-charging of the parasitic capacitor; and
a sensing amplifier electrically coupled to the data line configured to act as a buffer having unity gain to buffer and provide a sensing output, wherein the sensing output comprises a diode voltage of the one or more pixels or a driving current of the one or more pixels based at least in part on a current operation of the sensing circuitry, and wherein the sensing output is affected at least in part by a discharge of the parasitic capacitor; and
conversion circuitry configured to convert the sensing output from an analog domain to a digital domain.

2. The electronic device of claim 1, wherein the parasitic capacitor is pre-charged using the sensing amplifier.

3. The electronic device of claim 1, wherein the parasitic capacitor is pre-charged using the source amplifier.

4. The electronic device of claim 1, wherein a settling operation in the display circuitry is implemented when the scan TFT is set to an ON state, after the parasitic capacitor has been pre-charged.

5. The electronic device of claim 1, wherein the conversion circuitry is configured to signal average multiple sample outputs provided by the sensing amplifier and provide a signal average output for subsequent display circuitry adjustments by the electronic device.

6. The electronic device of claim 1, wherein the conversion circuitry comprises:
a switch configured to selectively couple and decouple the parasitic capacitor from the sensing amplifier; and
a current source configured to be applied to the sensing amplifier when the switch selectively decouples the parasitic capacitor from the sensing amplifier.

7. The electronic device of claim 6, wherein the conversion circuitry comprises:
a comparator configured to compare a reference voltage with the sensing output; and a counter configured to count time between the sensing output reaching the reference voltage, wherein the counter outputs the time.

8. The electronic device of claim 7, wherein the time is used to estimate voltage measurements.

9. The electronic device of claim 6, wherein the conversion circuitry comprises:
successive approximation (SAR) analog-to-digital circuitry, pipeline analog-to-digital circuitry, delta-sigma analog-to-digital circuitry, or any combination thereof.

10. The electronic device of claim 1, wherein the sensing amplifier comprises a voltage amplifier at or under at least +/−3 volts.

11. A method, comprising:
decoupling pixel circuitry of display circuitry of an electronic device from a data line of the display circuitry;
pre-charging a parasitic capacitor that is electrically coupled to the data line;
discharging voltage from the parasitic capacitor, by coupling the pixel circuitry with the data line;
sensing a diode voltage, by buffering the discharged voltage, via a sensing amplifier configured as a buffer having unity gain to provide a buffered discharged voltage when a switch coupling an output of the sensing amplifier to an input of the sensing amplifier is operated closed, and wherein the sensing amplifier is configured to integrate a driving current of the pixel circuitry to provide a driving current output when the switch is operated open; and
performing an analog-to-digital conversion on the buffered discharged voltage or on the driving current output.

12. The method of claim 11, comprising: decoupling the pixel circuitry from the data line by setting a scan thin-film-transistor (TFT) to an OFF state;
wherein the scan TFT, when set to an ON state causes an electrical coupling of a source amplifier of the display circuitry of the electronic device with the pixel circuitry of the display circuitry, and wherein the scan TFT, when set to the OFF state causes an electrical decoupling of the source amplifier and the pixel circuitry.

13. The method of claim 12, comprising:
pre-charging the parasitic capacitor using the source amplifier.

14. The method of claim 12, comprising:
pre-charging the parasitic capacitor using the sensing amplifier.

15. The method of claim 11, comprising:
implementing voltage settling, by coupling the pixel circuitry with the data line, such that the voltage from the parasitic capacitor is discharged.

16. The method of claim 15, comprising: coupling the pixel circuitry with the data line by setting a scan thin-film-transistor (TFT) to an ON state;
wherein the scan TFT, when set to the ON state causes an electrical coupling of a source amplifier of the display circuitry of the electronic device with the pixel circuitry of the display circuitry, and wherein the scan TFT, when set to an OFF state causes an electrical decoupling of the source amplifier and the pixel circuitry.

17. An electronic device, comprising:
conversion circuitry configured to:
receive a sensing output from a sensing amplifier configured to act as a buffer having unity gain in response to a switch coupled to the sensing amplifier being closed and configured to act as an integrator in response to the switch being open, wherein the sensing output comprises: a diode voltage of one or more pixels or a driving current of the one or more pixels, depending on a current operation of sensing circuitry of the electronic device; and
convert the sensing output from an analog domain to a digital domain using a time domain conversion (TDC) configuration, by:
electrically decoupling a parasitic capacitor of the sensing circuitry from the sensing amplifier of the sensing circuitry;
applying a current source for leakage compensation, calibration, and dual slope analog-to-digital-conversion to the sensing amplifier;
comparing a voltage of multiple samples of the sensing amplifier with a reference voltage;
counting a time between an initial voltage and the reference voltage, by the voltage of the multiple samples of the sensing amplifier, wherein the time is used by the electronic device, to estimate a multi-sample average voltage; and outputting the multi-sample average voltage in the digital domain.

18. The electronic device of claim 17, wherein the reference voltage is fixed.

19. The electronic device of claim 17, wherein the conversion circuitry comprises an additional switch configured to selectively couple and decouple the parasitic capacitor from the sensing amplifier.

20. The method of claim 11, wherein the diode voltage is configured to be a voltage generated at least in part by an operation of the pixel circuitry that causes a current to transmit through a diode of the pixel circuitry.

* * * * *